United States Patent
Hailey et al.

(10) Patent No.: US 7,595,646 B2
(45) Date of Patent: Sep. 29, 2009

(54) SYSTEM AND METHOD FOR INFORMATION HANDLING SYSTEM PERIPHERAL EMC TEST

(75) Inventors: Jeffrey C. Hailey, Austin, TX (US); Ernest Lentschke, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 247 days.

(21) Appl. No.: 11/538,456

(22) Filed: Oct. 4, 2006

(65) Prior Publication Data

US 2008/0084218 A1    Apr. 10, 2008

(51) Int. Cl.
*G01R 27/28* (2006.01)
(52) U.S. Cl. .................... 324/627; 330/284
(58) Field of Classification Search ............ 324/627, 324/628, 158.1; 330/284
See application file for complete search history.

(56) References Cited

U.S. PATENT DOCUMENTS 6,177,804 B1  1/2001  Pischl et al. .............. 324/627
6,930,496 B2 *  8/2005  Walcott ..................... 324/720
7,355,413 B2 *  4/2008  Motohashi et al. ......... 324/613
2006/0153495 A1 *  7/2006  Wynne et al. ............... 385/22

OTHER PUBLICATIONS http://www.home.agilent.com/agilent/product.jspx?nid=-536900342.536883024.00&cc=US&lc=eng "54006A 6 GHz Passive Divider Probe Kit" *Agilent Technologies*, Dec. 18, 2006 (1 page).
http://www.emcesd.com "Technical Tidbit" *D.C. Smith Consultants*, Dec. 18, 2006 (8 page).

* cited by examiner

*Primary Examiner*—Vincent Q Nguyen
(74) *Attorney, Agent, or Firm*—Hamilton & Terrile, LLP; Robert W. Holland

(57) ABSTRACT

Electromagnetic compatibility of an information handling system and peripheral for achieving defined electromagnetic interference constraints is tested through a test adapter that interfaces with an external cable connecting the information handling system and peripheral. Signals from the external cable are passed through an isolation resistor and parallel capacitance to compensate for input capacitance of a signal tester. A common mode choke isolates a common mode component of the signal at the external cable. A noise generator applies a signal through the test adapter to the external cable to allow measurement of signals emitted from the peripheral due to injected noise.

19 Claims, 4 Drawing Sheets

SYSTEM AND METHOD FOR INFORMATION HANDLING SYSTEM PERIPHERAL EMC TEST

BACKGROUND OF THE INVENTION

1. Field of the Invention

The present invention relates in general to the field of information handling system peripheral testing, and more particularly to a system and method for information handling system peripheral EMC test.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are growing consistently more powerful due, in part, to improvements in the components used to build information handling systems. For example, central processing units (CPUs) have seen greater numbers of features packed into a given area and have seen increases in operating speeds. Hard disk drives are built to rotate at greater speeds and retrieve and store information at greater rates. Random access memory (RAM) stores more information in a given area and stores and retrieves information with increased speed, such as with double data rate protocols. Information is communicated between components with serial links that have high frequency clock signals. Serial links have also substantially improved and simplified peripheral interfaces with information handling systems through external cables, such as interfaces with displays, mice, keyboards, printers and mass storage devices. As an example, the Universal Serial Bus (USB) is widely accepted through the industry to interface a wide variety of external peripherals with information handling systems.

One difficulty with the improved performance of information handling system components is that the greater operating speeds tend to produce greater amounts of electromagnetic interference (EMI). For example, current signaling schemes associated with high speed differential links operate at 3 GB/s for SAS and 4 GB/s for FC with future signaling schemes projected to operate at 10/GB/s or higher. Information handling system manufacturers are required by regulatory agencies to meet defined standards that limit the amount of EMI from a system. To meet regulatory standards, manufacturers design component layout and chassis shielding so that worst case operating conditions will not exceed defined EMI limits. The systems are typically tested by reading EMI with a spectrum analyzer located outside of the chassis. However, EMI measurements sometimes vary from predicted levels when information handling systems use peripherals interfaced through an external cable due to a common-mode component. The electromagnetic compatibility (EMC) of an information handling system with various peripherals is often difficult to predict since the EMC measurement sometimes exceeds the sum of the expected individual EMIs. For example, an information handling system interfaced by a USB cable with an external hard drive might exceed EMI requirements even though the information handling system and hard drive meet individual EMI requirements. Isolating the source of the excess EMI, such as hard drive operations versus the system data traffic or crosstalk onto external signals, is difficult.

SUMMARY OF THE INVENTION

Therefore a need has arisen for a system and method which tests information handling systems and peripherals for EMC, such as EMI related to a common-mode component.

In accordance with the present invention, a system and method are provided which substantially reduce the disadvantages and problems associated with previous methods and systems for testing the compatibility of information handling systems and peripherals for desired EMI constraints. A resistor divider probe interfaces with a differential wire pair to isolate and test a common mode component of signals sent between an information handling system and peripheral. Capacitance in parallel with the resistors of the probe compensate for the input capacitance of a test instrument so that testing bandwidth extends to multiple frequencies.

More specifically, a test adapter interfaces with a cable connecting an information handling system and a peripheral. The test adapter interfaces with the wires of the cable, such as a differential wire pair, a single ended wire or power/ground wires, so that signals sent through each wire is available at a connector for access by a test instrument, such as a spectrum analyzer. The interfaces between the connectors and the cable wires are made with a probe that has a capacitance in parallel with a resistance to extend the bandwidth of signals measurable by the test instrument. A resistor divider probe interfaces with a differential wire pair of a serial link to measure EMI associated with signals sent by the serial link to an information handling system. A common mode choke is disposed along the differential pair to isolate the common mode component of the signal. In addition to reading signals sent from a peripheral to an information handling system, the test adapter connectors allow insertion of noise to the cable so that the effectiveness of shielding of the peripheral can be tested.

The present invention provides a number of important technical advantages. One example of an important technical advantage is that information handling systems and peripherals are tested for EMC in an accurate and repeatable manner. A common mode component associated with interaction between an information handling system and peripheral is tested over bandwidths that extend through multiple frequency ranges, such as are used to communicate through a differential pair of a serial link. EMI measurements are available by reading signals across a cable with the information handling system and peripheral operating or by injecting noise through the cable to measure noise emitted from the peripheral. Repeatable results allow comparison of system performance against know measurements of emissions or immunity to determine acceptable levels of common-mode emissions and/or shielding.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A test adapter tests for electromagnetic compatibility of an information handling system and peripheral by interfacing with the cable connecting the information handling system and peripheral to detect electromagnetic interference associated with the cable or to inject noise into the cable to test shielding of the peripheral. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
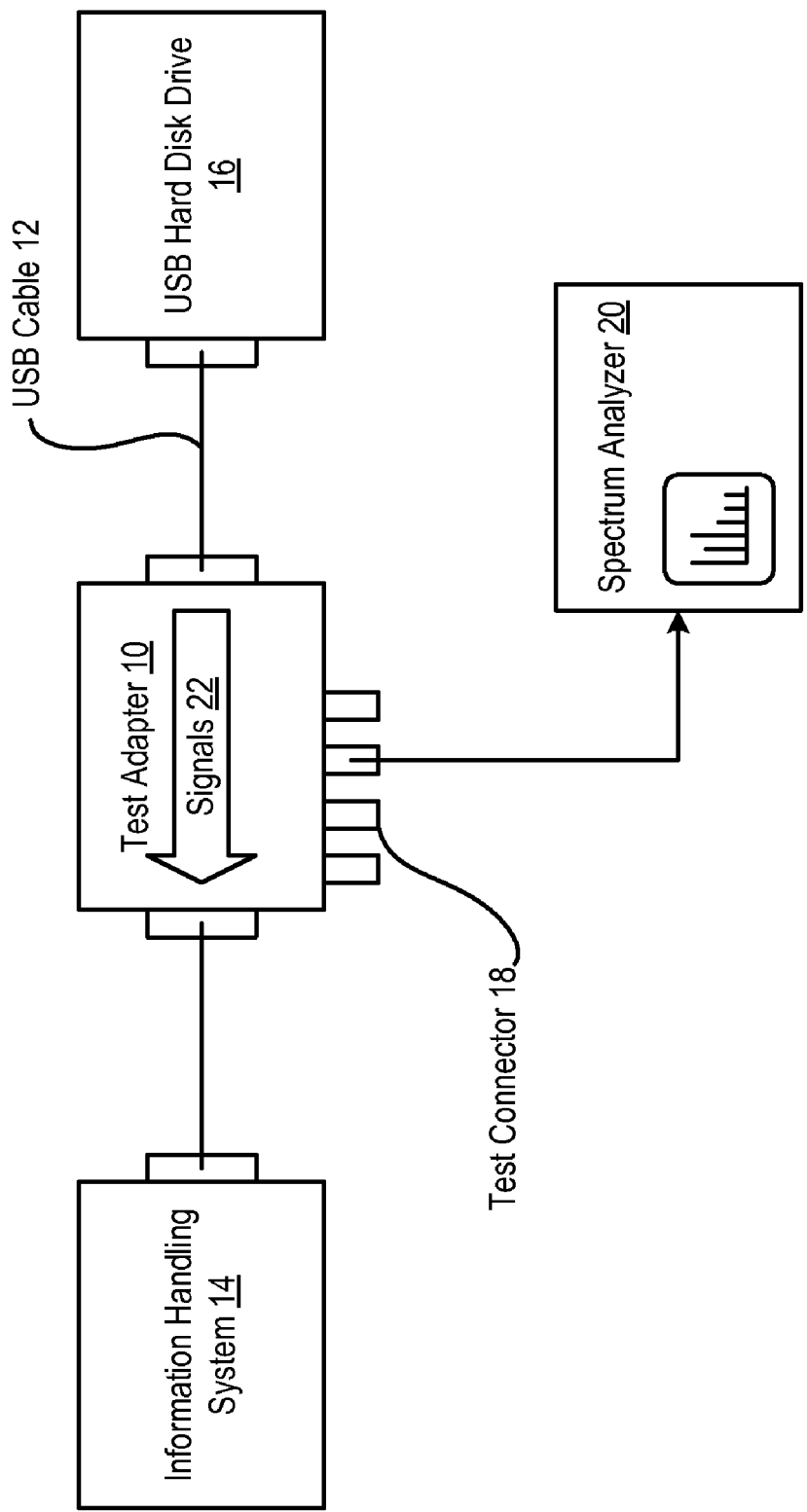
FIG. 1 depicts a block diagram of a test adapter configured to measure emissions associated with a USB cable interfacing an information handling system and a hard disk drive peripheral.
Figure 2:
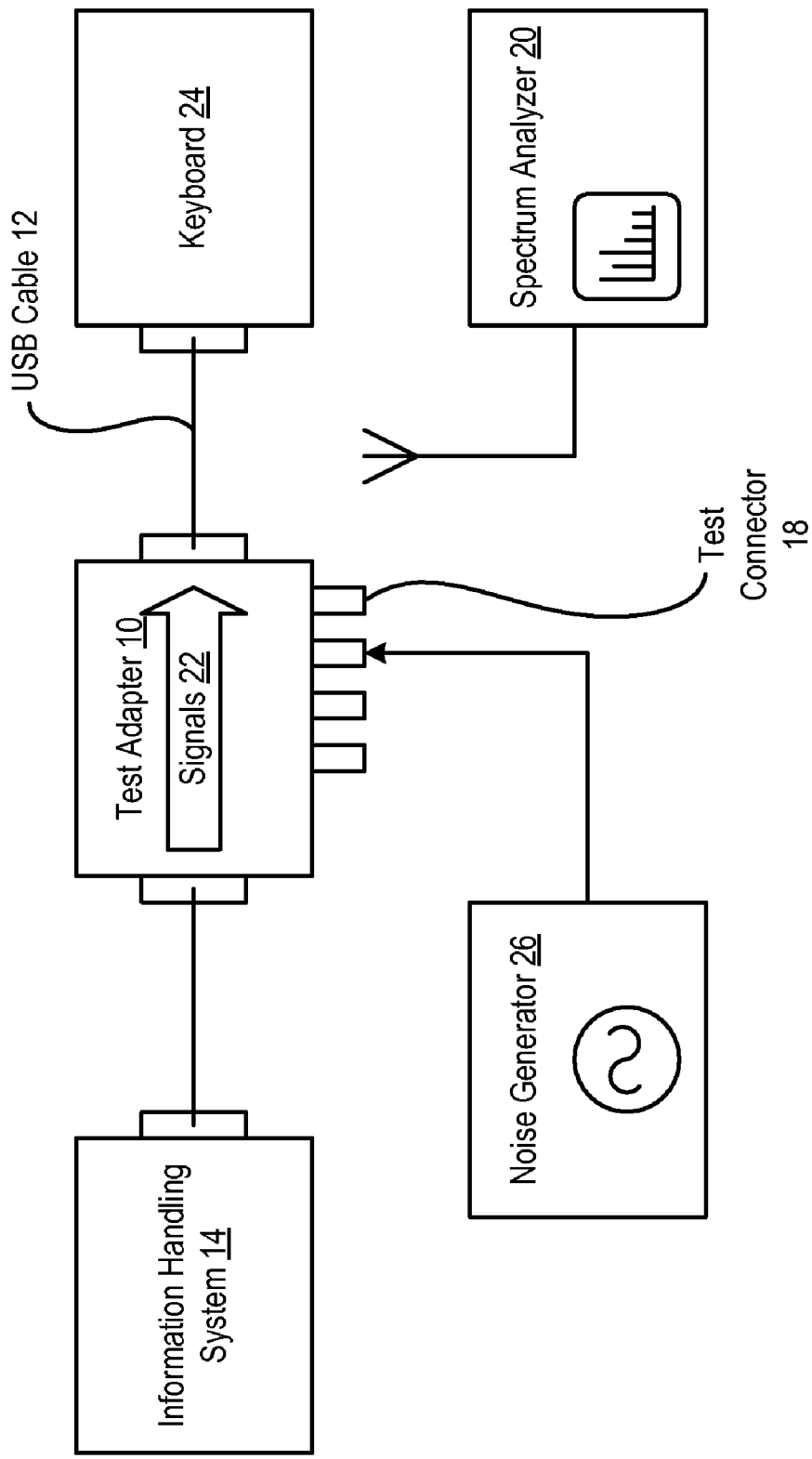
FIG. 2 depicts a block diagram of a test adapter configured to inject noise at a cable interfacing an information handling system and keyboard peripheral to measure the effectiveness of shielding of the keyboard and cable.

Referring now to FIG. 1, a block diagram depicts a test adapter 10 configured to measure emissions associated with a USB cable 12 interfacing an information handling system 14 and a hard disk drive peripheral 16. Information handling system 14 communicates information with hard disk drive 16 through USB cable 12 using standardized USB differential signaling. In alternative embodiments, alternative peripherals can interface with information handling system 14 with alternative cables 12. For example, displays, optical disc drives, mice, keyboards, storage networks or other types of peripherals are interfaced with test adapter 10 using Firewire, SATA, SAS, PCI Express, LVDS, TMDS or other types of serial differential link cables as well as unidirectional link cables, such as a video cable that sends RGB information. Test adapter 10 interfaces with the signals 22 communicated across cable 12, including ground and power signals, and provides a test connector 18 for each signal 22 so that a test instrument, such as a spectrum analyzer 20, can read and analyze the signals 22. As depicted by FIG. 2, analysis of signals 22 from a peripheral 16 to information handling system 14 helps to determine the source of EMI associated with combined operations of peripheral 16 and information handling system 14, such as a common mode component.

Referring now to FIG. 2, a block diagram depicts a test adapter 10 configured to inject noise at a cable 12 interfacing an information handling system 14 and keyboard peripheral 24 to measure the effectiveness of shielding of the keyboard and cable. A noise generator 26 generates emissions of a desired character and injects the noise through a test connector 18 and adapter 10 into cable 12. Test adapter 10, which is shielded to reduce inadvertent emissions, sends noise signals 22 through cable 12 to peripheral 24. A test instrument, such as spectrum analyzer 20, measures emissions from peripheral 24 to analyze the effectiveness of shielding for peripheral 24.

Figure 3:
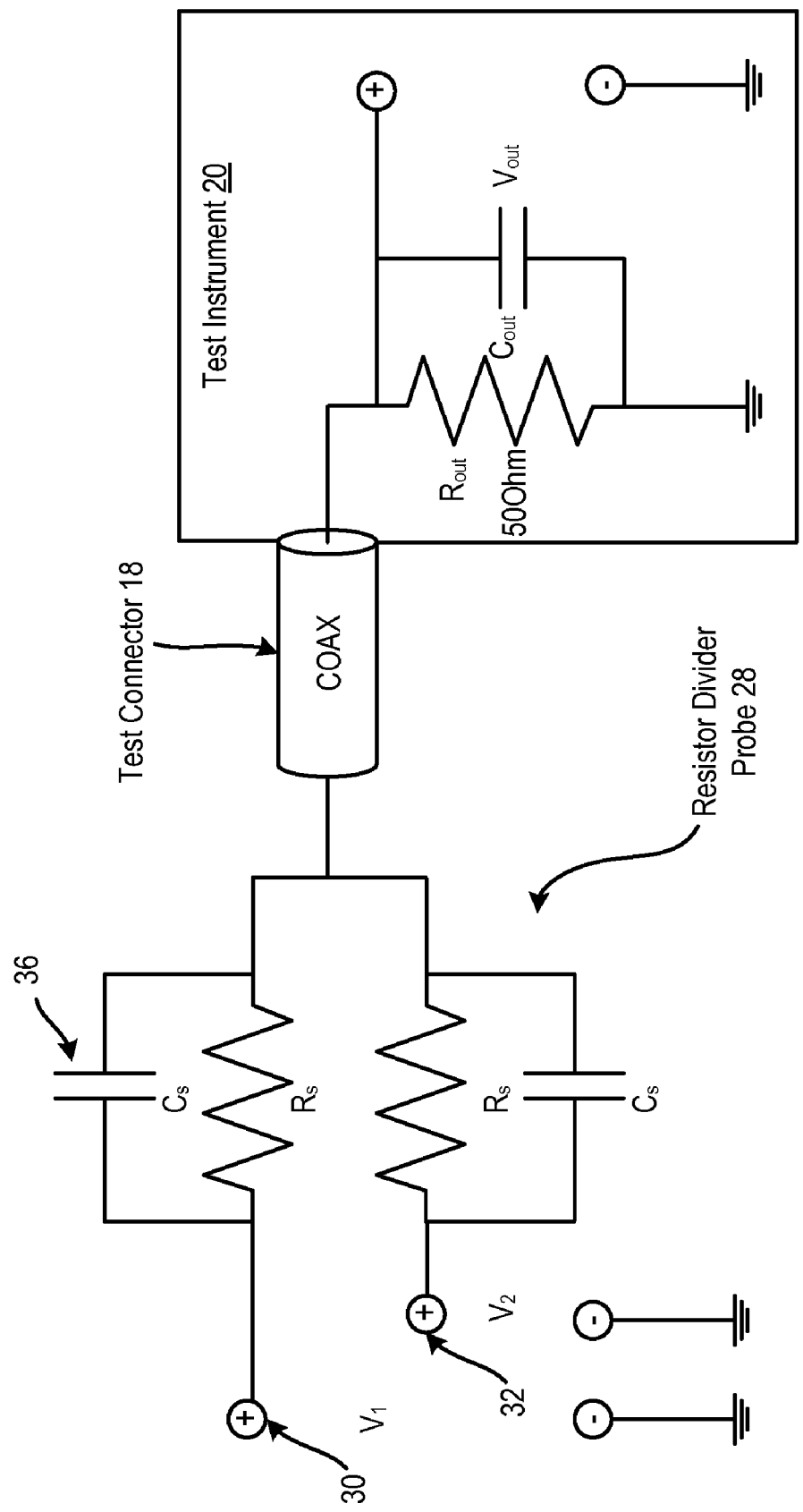
FIG. 3 depicts a circuit diagram of a dual-input resistive divider probe for interfacing with an information handling system external cable.

Referring now to FIG. 3, a circuit diagram depicts a dual-input resistive divider probe 28 for interfacing with an information handling system external cable. Resistor divider probe 28 has a first input V1 30 and second input V2 32 that each interface with a wire of a differential wire pair. Isolation resistors 34 are high-value resistors in parallel that interface with a test connector 18, such as a coaxial cable. For example, the resistance $R_s$ of isolation resistors 34 is 400 ohms to support connection to a 50 ohm coaxial cable and a 50 ohm test instrument 20 with division ration of approximately ⅒. A small capacitance 36 is added in parallel with isolation resistors 34 to compensate for input capacitance of test instrument 20. As set forth in the equation:

$$\frac{V_{out}}{V_1+V_2} = \frac{Z_{out}}{Z_1+2\cdot Z_{out}} = \frac{R_{out}}{R_s\left(\frac{1+S\cdot C_{out}\cdot R_{out}}{1+S\cdot C_S\cdot R_S}\right)+2\cdot Z_{out}}$$

When $R_s$ of isolation resistors 34 times the capacitance $C_s$ of capacitors 36 is substantially equal to the resistance $R_{OUT}$ and capacitance $C_{OUT}$ associated with test instrument 20, frequency dependence for test signals falls out. Removal of the frequency dependence by insertion of capacitors 36 in parallel with isolation resistors 34 allow the bandwidth subject to testing to extend to multiple GHz, such as the frequency ranges associated with high speed serial links. In addition to flat frequency measurements, resistor divider probe 28 can be given correction factors for frequency domain measurements. In one embodiment, capacitance 36 is added by wrapping copper tape or other conductive materials over each isolation resistor 34.

Figure 4:
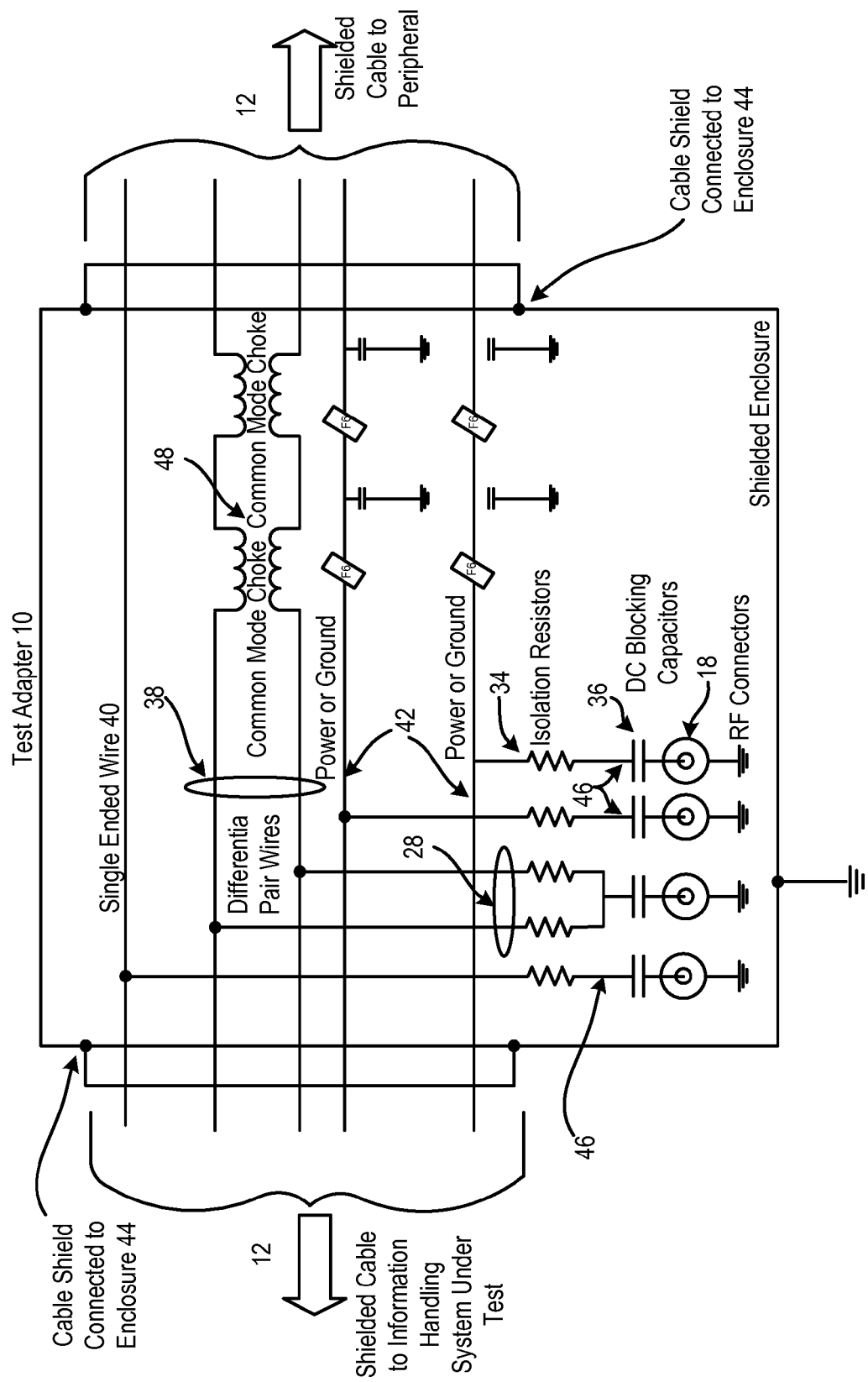
FIG. 4 depicts a circuit diagram of a test adapter for measuring the electromagnetic compatibility of an information handling system and peripheral.

Referring now to FIG. 4, a circuit diagram depicts a test adapter 10 for measuring the electromagnetic compatibility of an information handling system and peripheral. In the example embodiment of FIG. 4, cable 12 can be a differential serial link having a differential pair of wires 38 or a unidirectional link having a single ended wire 40. One or more power or ground wires 42 provide cable 12 with power and a ground reference. Test adapter 10 has a shielded housing and cable shields 44 that prevent entry or escape of EMI from test adapter 10. For example, test adapter 10 has opposing USB ports 44 so that a USB cable from an information handling system connects to one port and a cable from a peripheral connects to another port. Within test adapter 10's shielded enclosure, a resistor divider probe 28 interfaces an RF connector 18 with differential pair wires 38 while single probes 46 interface single ended wire 40 and power/ground wires 42 with connectors 18. In order to read signals received from a peripheral, a test instrument is connected to the appropriate connector 18, and in order to provide noise to a peripheral, a noise generator is instead connected to the connector 18. A common mode choke 48 disposed along differential pair wires 38 support testing of EMI with isolation of the common mode component of the signal sent along cable 12.

Although the present invention has been described in detail, it should be understood that various changes, substitutions and alterations can be made hereto without departing from the spirit and scope of the invention as defined by the appended claims.

What is claimed is:

1. A system for measuring electromagnetic interference associated with an information handling system and peripheral communicating over a cable, the system comprising:
    a housing;
    a first cable connector disposed in the housing and operable to connect with a cable from the information handling system;
    a second cable connector disposed in the housing and operable to connect with a cable from the peripheral;
    a cable circuit disposed in the housing and operable to communicate signals between the first and second cable connectors;
    a measurement circuit interfaced with the cable circuit to receive the signals;
    tester connector interfaced with the measurement circuit to communicate signals between a tester and the cable circuit;
    an isolation resistor disposed in the measurement circuit;
    a blocking capacitor disposed in parallel with the isolation resistor, the blocking capacitor sized to compensate input capacitance associated with the tester.

2. The system of claim 1 wherein the cable comprises a differential pair of wires, the measurement circuit comprising a first wire interfacing a first of the differential pair of wires to a first connector and a second wire interfacing a second of the differential pair of wires to a second connector.

3. The system of claim 2 further comprising a common mode choke disposed in the cable circuit and operable to isolate a common mode component of the signal for communication to the first and second connectors.

4. The system of claim 2 wherein the cable comprises a USB cable.

5. The system of claim 2 wherein the cable comprises a PCI Express cable.

6. The system of claim 2 wherein the cable comprises an SAS cable.

7. The system of claim 1 wherein the cable comprises a unidirectional cable having a single ended signal.

8. The system of claim 7 wherein the unidirectional cable comprises a video cable.

9. The system of claim 1 wherein the cable comprises a power cable.

10. The system of claim 1 wherein the comprises a ground cable.

11. A method for measuring electromagnetic interference associated with communication of a signal between an information handling system and a peripheral through an external cable, the method comprising:
    interfacing a measurement cable with the external cable;
    disposing an isolation resistor in the measurement cable;
    disposing a capacitance in parallel with the isolation resistor; and interfacing the measurement cable with a tester to read signals from the external cable; interfacing a common mode choke with the external cable to isolate a common mode component of the signal; and measuring the common mode component with the tester.

12. The method of claim 11 wherein the external cable comprises a differential pair that supports serial link signals.

13. The method of claim 11 wherein the external cable comprises a USB cable.

14. The method of claim 11 wherein the external cable comprises a SATA cable.

15. The method of claim 11 wherein the external cable comprises a Firewire cable.

16. The method of claim 11 wherein the external cable comprises a ground cable.

17. The method of claim 11 wherein the external cable comprises a power cable.

18. The method of claim 11 further comprising:
    interfacing the measurement cable with noise generator;
    injecting noise through the measurement cable to the external cable; and
    measuring noise radiated proximate the peripheral.

19. The method of claim 11 wherein the capacitance comprises conductive material wrapped over the isolation resistor.

* * * * *